United States Patent [19]

Frieling

[11] Patent Number: 4,565,933
[45] Date of Patent: Jan. 21, 1986

[54] CIRCUIT FOR GENERATING RAPID PULSES

[75] Inventor: Focko Frieling, Munich, Fed. Rep. of Germany

[73] Assignee: Siemens Aktiengesellschaft, Berlin and Munich, Fed. Rep. of Germany

[21] Appl. No.: 491,986

[22] Filed: May 5, 1983

[30] Foreign Application Priority Data

May 7, 1982 [DE] Fed. Rep. of Germany ....... 3217264

[51] Int. Cl.$^4$ .................... H03K 17/04; H03K 17/693
[52] U.S. Cl. .................................... 307/269; 307/578; 307/583; 307/246; 307/601
[58] Field of Search ............... 307/443, 448, 453, 481, 307/482, 577, 578, 582, 583, 246, 269, 594, 601, 605

[56] References Cited

U.S. PATENT DOCUMENTS

| | | | |
|---|---|---|---|
| 3,988,617 | 10/1976 | Price | 307/453 |
| 4,061,929 | 12/1977 | Asano | 307/246 |
| 4,382,194 | 5/1983 | Nakano et al. | 307/482 X |
| 4,431,927 | 2/1984 | Eaton, Jr. et al. | 307/578 X |
| 4,451,748 | 5/1984 | Amrany | 307/246 X |
| 4,472,644 | 9/1984 | Kirsch | 307/578 X |

Primary Examiner—Stanley D. Miller
Assistant Examiner—D. R. Hudspeth
Attorney, Agent, or Firm—Herbert L. Lerner; Laurence A. Greenberg

[57] ABSTRACT

Integrated pulse former constructed in MIS circuit technology and connected to a first supply potential as well as to a second supply potential serving as a reference potential, and acted upon by control pulses from a pulse generator, which includes a first former part and a second former part directly addressed by the control pulses from the pulse generator, the first former part being connected to both the first and the second supply potentials and having three signal outputs, the second former part being additionally controlled via the three signal outputs of the first former part and being connected only to the first one of the two supply potentials, a first one of the signal outputs connected to and controlling a gate of a first field-effect transistor having a source-chain path directly connected, on one hand, to an output of the pulse generator furnishing the control pulses and, on the other hand, to a signal output of the second former part for furnishing secondary pulses, a second one of the three signal outputs of the first former part being connected to and controlling a gate of a second field-effect transistor having a source-drain path connecting the signal output of the second former part to one terminal of a capacitor having another terminal connected to the third one of the three signal outputs of the first former part, the one terminal of the capacitor connected to the second field-effect transistor being also connected via a third field-effect transistor to the first supply potential, the third field-effect transistor having a gate controllable, respectively, by the first supply potential and by pre-charging pulses applied to the first former part for controlling the first former part; and means provided for effecting a return of the first, second and third potentials at the respective signal outputs of the first former part to a state prevailing before onset of a final control pulse, after the end of the falling edge of the control pulses from the pulse generator and before onset of the rising edge of the next control pulse.

10 Claims, 6 Drawing Figures

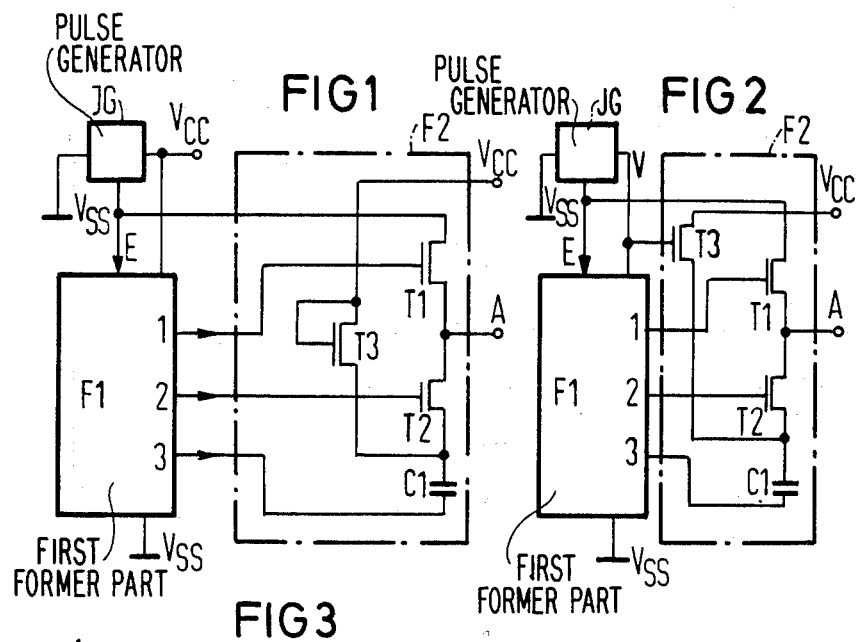
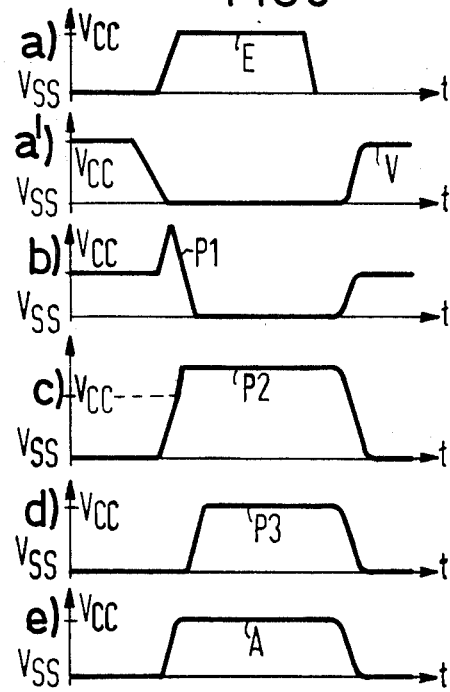
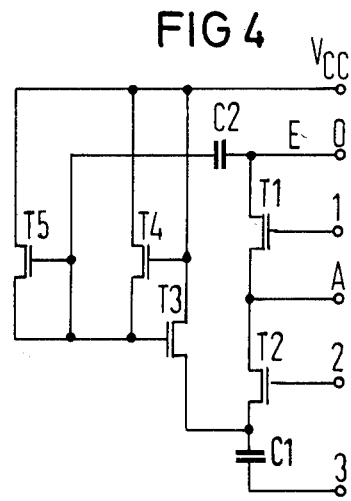

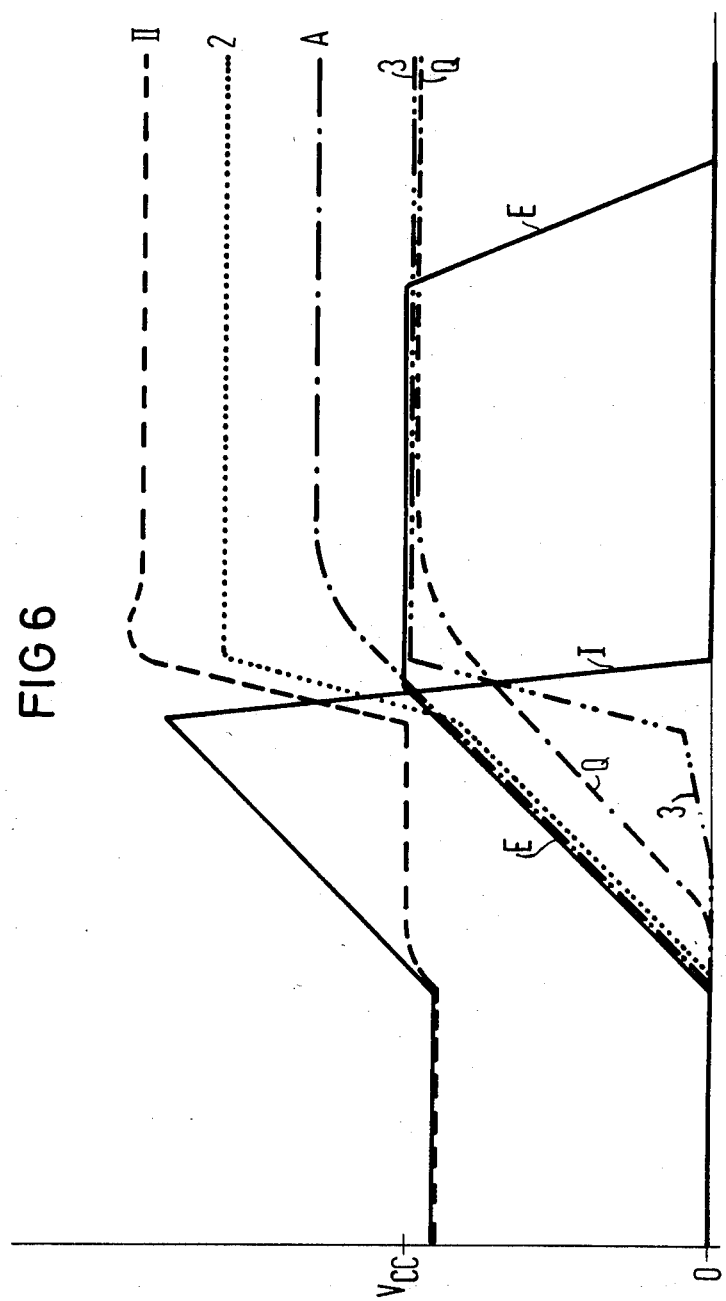

CIRCUIT FOR GENERATING RAPID PULSES

The invention relates to an integrated pulse former constructed in MIS circuit technology which is connected to a first supply potential as well as to a second supply potential serving as reference potential, and is acted upon by control pulses from a pulse generator.

Such pulse formers are often required for dynamic MOS circuits, especially for RAM memories with one-transistor memory cells, for the operating control. The principle used with such pulse formers is based on the fact that, in the pulse former, due to the primary pulses furnished by the oscillator, a generation of secondary pulses are triggered which are then passed-on for further use in the circuit to be supplied. The secondary pulses are generated in accordance with a time raster determined by the design of the circuit for the pulse former. In view of the minimum switching time attainable with MIS field-effect transistors, especially with MOS field-effect transistors, always only a fixed time raster is possible in the available converters, from which deviations are able to be effected only to a very small extent by changing transistor parameters (primarily by w/1-changes).

In cases wherein the real circuit situation (for example, of redesign measures) is not amenable to exact simulation (for example, the word-line loading due to changes of the chip dimensions or the word line slope), an existing time raster (timing) can be deactivated i.e. altered, virtually only via w/1-changes is the MOS field-effect transistors used in the memory circuit or in the remaining integrated MOS circuit. This procedure, however, can be used only to a narrowly limited extent because the operation of the converter is impaired thereby and because, furthermore, this can result in an increased process dependence as well as in a large change of the time delay between the individual control pulse and the secondary pulse triggered thereby, or even in a complete failure in the arrival of the delayed pulses. In addition, the aforementioned possibility of influencing the timing is not applicable if the delay of the secondary pulses obtained via the converter relative to the triggering primary pulses is to be less than about 5 nsec.

A basically advantageous embodiment for a pulse former designed in MOS technology is described in "IEEE Journal of Solid-State Circuits", vol.SC-15, no. 5, October 1980, pages 839 to 845 and is shown there on page 844 in a circuit diagram in FIG. 11(a). However, this heretofore known pulse former alone is also not capable of reducing the delays to less than 5 nsec between the individual primary pulses furnished by the pulse generator and the secondary pulses delivered at the converter output.

It is accordingly an object of the invention to provide an integrated pulse former which derives, from a primary pulse E furnished by a pulse generator, a secondary pulse having a time delay relative to the generator pulse E which is determined only by the switching time of a single transistor.

With the foregoing and other objects in view, there is provided, in accordance with the invention, an integrated pulse former constructed in MIS circuit technology and connected to a first supply potential as well as to a second supply potential serving as a reference potential, and acted upon by control pulses from a pulse generator, comprising a first former part and a second former part directly addressed by the control pulses from the pulse generator, the first former part being connected to both the first and the second supply potentials and having three signal outputs, the second former part being additionally controlled via the three signal outputs of the first former part and being connected only to the first one of the two supply potentials, a first one of the signal outputs connected to and controlling a gate of a first field-effect transistor having a source-drain path directly connected, on one hand, to an output of the pulse generator furnishing the control pulses and, on the other hand, to a signal output of the second former part for furnishing secondary pulses, a second one of the three signal outputs of the first former part being connected to and controlling a gate of a second field-effect transistor having a source-drain path connecting the signal output of the second former part to one terminal of a capacitor having another terminal connected to the third one of the three signal outputs of the first former part, the one terminal of the capacitor connected to the second field-effect transistor being also connected via a third field-effect transistor to the first supply potential, the third field-effect transistor having a gate controllable, respectively, by the first supply potential and by precharging pulses applied to the first former part for controlling the first former part, the first former part being of such construction that, due to a rising edge of the control pulses from the pulse generator in the first former part:

(a) at the first signal output of the first former part, a first potential initially maintained at a value between the two supply potentials is increased to a peak value beyond that of the first supply potential and then immediately lowered to the value of the second supply potential;

(b) at the second signal output of the first former part, a second potential initially having a value equal to that of the second supply potential is first brought to the value of the first supply potential and then, with increased rate of rise, to a value beyond that of the first supply potential which is also maintained after the falling edge of the respective control pulse; and (c) at the third signal output of the first former part, a third potential initially having a value equal to that of the second supply potential is raised with delay to the value of the first supply potential; and means provided for effecting a return of the first, second and third potentials at the respective signal outputs of the first former part to a state prevailing before onset of a final control pulse, after the end of the falling edge of the control pulses from the pulse generator and before onset of the rising edge of the next control pulse.

In accordance with another feature of the invention, the first, second and third field-effect transistors are of a self-blocking or enhancement type and have the same channel doping, the third field-effect transistor being acted upon at the gate thereof by the first supply potential.

In accordance with an additional feature of the invention, the gate of the third field-effect transistor is connected directly to the first supply potential.

In accordance with a further feature of the invention, the gate of the third field-effect transistor is controlled by pre-charging pulses occurring in spaces between the control pulses, the field-effect transistors of the second former part having identical channel dopings, the third field-effect transistor being of self-conducting or depletion type and the first and the second field-effect transistors being of self-blocking or enhancement type.

In accordance with again another feature of the invention, a fourth field-effect transistor and a fifth field-effect transistor of the same type as that of the first, second and third field-effect transistors, as well as a second capacitor are provided in the second former part, and the gate of the third field-effect transistor is connected to the first supply potential via parallel connected source-drain paths of the fourth and the fifth field-effect transistors, the gate of the third field-effect transistor being also connected to a gate of the fifth field-effect transistor and, via the second capacitor, to an output of the pulse generator furnishing the control pulses, the fourth field-effect transistor having a gate connected to the first supply potential.

In accordance with still another feature of the invention, the first former part comprises eleven field-effect transistors of the same type as that of the first field-effect transistor in the second former part, and a capacitor, and is controlled not only by the control pulses from the pulse generator but also by pre-charging pulses confined to the pauses between adjacent control pulses.

In accordance with yet an additional feature of the invention a first field effect transistor of the first former part is connected by its drain to the first supply potential and forms with its source the third signal output of the first former part and is connected via a second field-effect transistor of the first former part to the second supply potential; the first transistor of the first former part having a gate connected, on one hand, to the second signal output and, on the other hand, to a gate of a third field-effect transistor of the first former part as well as to one terminal of a capacitor having a second terminal connected to a source terminal of the third transistor of the first former part, the third transistor of the first former part also having a drain connected to the first supply potential and, via a fourth transistor of the first former part, to the second supply potential; respective gates of a second and a fourth transistor of the first former part being jointly connected to a circuit point located between a seventh and a ninth transistor of the first former part, the seventh transistor being connected to the first supply potential and being controlled by the pre-charging pulses, the seventh transistor being also connected by its source terminal via an eight field-effect transistor of the first former part controlled by control pulses from the pulse generator, to the first signal output of the first former part as well as to a gate of a fifth transistor of the first former part and to the source of a sixth transistor of the first former part; a source terminal of the fifth field-effect transistor of the first former part being connected to the gate of the third field-effect transistor of the first former part and its drain terminal to the output of the pulse generator furnishing the control pulses, the drain of the sixth transistor being connected to the terminal for the first supply potential and the gate of the sixth transistor being controlled by the pre-charging pulses; the pre-charging pulses further serving for controlling the gate of a tenth field-effect transistor of the first former part having a source terminal connected to the second supply potential and having a drain connected to the gate of the ninth transistor and to the first supply potential via a source-drain path of an eleventh field-effect transistor of the first former part controlled by the control pulse; the ninth transistor as well as the second transistor of the first former part, the fourth transistor of the first former part and the tenth transistor being connected to the second supply potential.

In accordance with a concomitant feature of the invention, the signal output of the second former part is connected to a gate of a sixth field-effect transistor of the same type as that of the first transistor in the second former part; the sixth transistor having a drain connected to the first supply potential and having a source terminal forming a further signal output of the second former part and, in addition being connected via a source-drain path of a seventh field-effect transistor to the second supply potential, the seventh field-effect transistor having a gate controlled either by the pre-charging pulses or by an output circuit controlled by the control pulse and a further pulse and formed of an eighth and a ninth field-effect transistor.

In general, the MIS field-effect transistors used in this circuit, especially MOS field-effect transistors, have the same conductivity type of the current carrying channel thereof. In a preferred embodiment of the invention, moreover, only self-blocking field-effect transistors are used.

A pulse generator represented as a circuit diagram in the afore-cited publication "IEEE Journal of Solid-State Circuits" on page 344 thereof can be used advantageously as the first former part of the invention of the instant application, as shown in greater detail in FIG. 5 of the drawing in this application.

Other features which are considered as characteristic for the invention are set forth in the appended claims.

Although the invention is illustrated and described herein as embodied in the integrated pulse former, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1 and 2 are circuit diagrams of the simplest embodiments of the pulse former according to the invention;

FIG. 3 is a plotted pulse diagram corresponding to the embodiments of FIGS. 1 and 2;

FIG. 4 is a circuit diagram of a further embodiment of the second former part F2 of FIGS. 1 and 2;

FIG. 6 is a plotted timing diagram corresponding to the embodiment according to FIG. 5.

Figure 5:
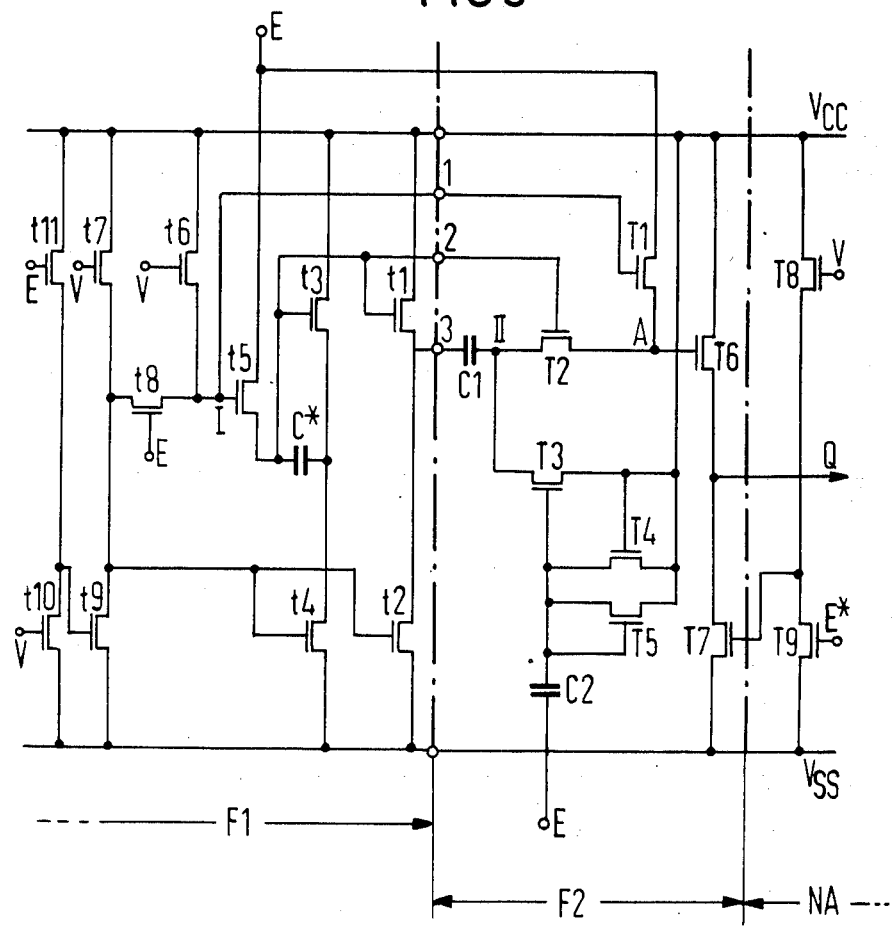
FIG. 5 is a circuit diagram of yet a further improved second former part F2 together with an advantageous embodiment of the first former part F1 according to the invention.

Referring now to the drawing and first, particularly, to FIG. 1 thereof, there is shown an integrated pulse former which includes a pulse generator IG furnishing primary pulses i.e. control pulses E, provided for controlling a first former part F1 as well as a second former part F2. The first former part F1 has a first signal output 1 which carries a signal P1 and serves for controlling a gate of a first field-effect transistor T1. A second signal output 2 serves for controlling a second field-effect transistor T2 and delivers a signal P2. The two field-effect transistors T1 and T2 as well as other MOS field-effect transistors used in the circuit according to FIG. 1, especially the field-effect transistor T3, also, are all self-blocking and preferably of the n-channel type. Of course, an embodiment which is also sensible, is one wherein all of the MOS field-effect transistors used are of the p-channel type.

The current-carrying paths of the first field-effect transistor T1 and the second field-effect transistor T2 are connected in series, and the signal output A of the second former part F2 and, accordingly, of the simpler form of the pulse former according to the invention, are realized by a node between the two transistors T1 and T2. The source of the second transistor T2 is directly connected to the first terminal of a capacitor C1 and is also applied to the source of the aforementioned third field-effect transistor T3. The second terminal of the aforementioned capacitor C1 is connected to the third signal output 3 of the first former part F1. In the very simplified embodiment of the invention shown in FIG. 1, the gate of the third field-effect transistor T3 is directly connected to the drain of the transistor T3 as well as to the first supply potential $V_{cc}$. On the other hand, in accordance with the invention, no connection is provided between a supply terminal of the second former part F2 and the second supply potential $V_{ss}$ which is connected as the reference potential.

The control pulses E delivered by the pulse generator IG are applied to a corresponding control input of the first former part F1 as well as to a control input of the second former part F2, which is represented by the drain terminal of the first transistor T1 in the second former part F2.

In the embodiment of the invention according to FIG. 1, the third transistor T3 is connected as a charging resistor for a capacitor C1. The charging state of this capacitor C1 depends, on the one hand, upon the behavior of the first and the second field-effect transistors T1 and T2 as well as on the signal state P3 at the third signal output 3 of the first former part F1. The same obviously applies also to the signal state at the signal output A of the circuit shown in FIG. 1 and, accordingly, to the secondary signal delivered by the output A (and likewise identified by the reference character "A").

In FIG. 3, the time-behavior of the control signals W, the potentials P1, P2, P3 at the first, second and third signal output, respectively, of the first former part F1 as well as of the output signal A are represented. Further shown in FIG. 3 is the waveform of the pre-charging pulses V which are required in the embodiment of the invention according to FIG. 2, as well as in a construction of the first former part F1 according to FIG. 5, and which are also otherwise conventional in the operation of dynamic memories.

With the rising edge of each of the control pulses E, the following behavior of the circuit shown in FIG. 1 is triggered, in addition to the waveforms shown in FIG. 3 at the signal outputs 1, 2 and 3 of the first former part F1. Initially, the capacitor C1 is charged to a voltage $V_{cc}-U_T(T3)$, wherein $U_T(T3)$ is the threshold voltage for the third field-effect transistor T3. The transistor T3 conducts prior to the start of the rising edge of the control pulse E, so that the signal input of the former part F2 (i.e. the drain of T1) which is to be driven by the control pulses, is connected to the signal output A of the second former part F2. The voltage value of the signal P1 has the waveform shown in FIG. 3 and corresponds to the definition of the invention presented in point a) mentioned hereinbefore. Since the voltage of P1 rises due to this waveform together with the rising edge of the control pulse E and, then, beyond the first supply potential $V_{cc}$, the conducting connection between the input controlled by the pulses E and the signal output A of the second former part is preserved. The voltage value P2 at the gate of the second field-effect transistor T2 initially does not lead to a conducting state of this transistor, because its source potential remains constant at the value $V_{cc}-U_T(T3)$ during the rise of the control pulse E. Only if the potential at the signal output terminal A has reached the value of the first supply potential $V_{cc}$ (which results from the cooperation of the control pulse E and the signal P1 at the first output 1 of the first former part F1), is the voltage P1 at the output 1 of the first former part F1 switched to the value of the second supply potential $V_{ss}$, so that the transistor T1 blocks the connection between the input of the second former part F2, which input is controlled by the control pulses E, and the signal output A. Simultaneously, the potential P2 at the second signal output 2 of the first former part F1 and, thus, at the gate of the second field-effect transistor T2, is brought to a value above the first supply potential $V_{cc}$. Furthermore, also, the potential at the source terminal of the second field-effect transistor T2 is increased via the capacitor C1 due to the signal P3 which can be taken off at the signal output 3 of the first former part F1. The second transistor T2 thus becomes conducting, so that the signal output A of the second former part F2 can then be raised to a voltage value above $V_{cc}-V_{ss}$, indeed, very rapidly.

This extremely fast generation of a secondary pulse having a raised voltage value in comparison with the supply voltage ($V_{cc}-V_{ss}$) is the advantage obtained due to a circuit according to FIG. 1. If the signal available at the signal output A is then used for controlling a further MOS field-effect transistor, for example, the transistor T6 in the embodiment according to FIG. 5, the time delay of the signal Q delivered at the signal output of this further transistor T6 relative to the control pulse E triggering this signal pulse Q is determined only by the switching time of this further transistor T6.

The modification of the circuit of a pulse former according to the invention shown in FIG. 2 differs from the circuit according to FIG. 1 in that the third field-effect transistor T3 (in contrast with the first transistor T1 and the second transistor T2) is of the self-conducting or depletion type and is controlled at the gate thereof by the aforementioned pre-charging pulses V (the waveform of which is also shown in FIG. 3) and not, as in FIG. 1, by the first supply potential $V_{cc}$. These pre-charging pulses V, which are exclusively limited to the pulse pauses or spaces between the control pulses E supplied by the pulse generator IG, are generated in a conventional manner. Suitable pulse generators of this type are described, for example, in German Published, Non-Prosecuted Application (DE-OS) No. 27 13 319.

The modification shown in FIG. 2 of a circuit according to FIG. 1 has the effect that the starting value at the source of the second transistor T2 is equal to the first supply potential $V_{cc}$, whereby voltage losses at the output A of the second former part F2 during the transition of the second transistor T2 from the non-conducting state to the conducting state i.e. at the instant of the connection of the signal output A to the source terminal of the second field-effect transistor T2 and, accordingly, to the capacitor C1, the potential of which remains at the value $V_{cc}-U_T(T2)$, are avoided. Thereby, an even higher signal voltage may be obtained at the output A of the second former part F2 than in a construction according to FIG. 1.

Because the third field-effect transistor T3 in this embodiment is of the self-conducting or depletion type, the gate voltage thereof must be lowered during the rise of the voltage at the source terminal thereof, so that part of the increase effect is not suppressed by connection to the first supply potential $V_{cc}$.

The embodiment of a pulse former according to the invention shown in FIG. 4 is further developed and improved over the embodiment according to FIG. 1. In this further embodiment, mainly two further MOS field-effect transistors T4 and T5 of the same type as that of the transistors T1, T2 and T3, as well as a second capacitor C2, are provided. The two additional transistors T4 and T5 are connected by the drain thereof to the first supply potential $V_{cc}$ and by the source thereof to the gate of the third field-effect transistor T3. Furthermore, the gate of the fourth transistor T4 is connected to the first supply potential $V_{cc}$, and the gate of the fifth transistor T5, on the one hand, likewise to the gate of the third field-effect transistor T3 and, on the other hand, via the capacitor C2, to the drain of the first field-effect transistor T1, and is therefore also controlled directly by the control pulse E furnished by the pulse generator IG.

As compared with a circuit according to FIGS. 1 and 2, what is achieved by this further embodiment according to FIG. 4 is that the potential at the source terminal of the second transistor T2 is raised to the value of the first supply potential $V_{cc}$ before the start of the rise of the individual control pulse E, so that the effect of the overall circuit thus corresponds to that of the circuit according to FIG. 2. The effect of the embodiment of the third field-effect transistor T3 provided there as a self-conducting field-effect transistor as well as the control of this transistor T3 by the pre-charging pulses V is replaced by the effect of the embodiment of the second former part F2 according to FIG. 4 due to the effect of the two additional field-effect transistors T4 and T5. An alternative is thus provided to achieve the improvement described hereinbefore with respect to the increased signal voltage at the output A either exclusively with field-effect transistors of the self-blocking or enhancement type and the additional expense of two additional transistors, or by a realization of the third transistor T3 deviating from the realization of the remaining transistors T1 and T2.

The embodiment of a pulse former according to the invention of the instant application represented in FIG. 5 shows the combination of a second former part F2 which is constructed in accordance with FIG. 4 and is supplemented on the output side by the aforementioned transistor T6, with an embodiment for the first former part F1 which is preferably to be used.

The supplementation of the second former part F2 by an output circuit NA, as shown in FIG. 5, which is provided in addition to the sixth field-effect transistor T6 provided as a supplement of the second former part F2 and a further transistor T7, serves for controlling the source potential for the sixth transistor T6, which is preferably to be used, and which supplies output signals Q. Besides the output signal Q, however, the pulses A which appear at the output A of the second former part F2 may also be used to advantage, as mentioned hereinbefore.

The drain of the sixth field-effect transistor T6 which is controlled at the gate thereof by the output A of a circuit according to FIG. 4 (or according to FIG. 2, as well) is connected to the first supply potential $V_{cc}$, and the source of the sixth field-effect transistor T6 is connected to the second supply potential $V_{ss}$ via the source-drain path of the aforementioned seventh field-effect transistor T7. In addition, the secondary pulses, which appear with an extremely small delay relative to the corresponding control pulses E, can be taken off at the signal output Q located between the source of the sixth transistor T6 and the drain of the seventh transistor T7 of the further supplemented second former part F2.

The gate of the seventh field-effect transistor T7 is controlled by a node which is located between the two field-effect transistors T8 and T9 which form the output circuit NA. The drain of one of the series-connected transistors of the output circuit, namely, of the transistor T8, is connected to the first supply potential $V_{cc}$, and the gate of the transistor T8 is controlled by the aforementioned pre-charging pulses V. The source of the second transistor T9 in the output circuit NA is connected to the second supply potential $V_{ss}$, and the gate of the transistor T9 is controlled by pulses E*. These pulses E* set-in somewhat sooner in time than the pulses E and last for the respective duration thereof. The pulses E* may be generated, for example, by an inverter, the input of which is controlled by the pre-charging pulses V, if the pre-charging pulses V and the respective control pulses E which immediately precede or follow them are separated from one another by a voltageless phase.

It should be mentioned in this connection that the transistors T1 to T9 used in the former part F2 according to FIG. 5 are of the same channel type and are all preferably realized as self-blocking field-effect transistors i.e. as field-effect transistors of the enhancement type.

A result of the supplements of the second former part F2 shown in FIG. 5 is that, at the signal output furnishing the output signals Q, there appears after the rising edge of the individual control pulses E, a rising potential which is delayed essentially only by the action of the sixth field-effect transistor T6, and which remains also if the individual control pulse E is switched off again. By the pre-charging pulse V, the original state is restored in the first former part F1 as well as in the second former part F2 and in the output circuit NA. However, so that the fast rise at the output of the supplemented former part F2 furnishing the secondary pulses Q is not impeded by the high gate voltage which was generated by the pre-charging, because the transistor T7 remains longer in the conducting state, the gate of the seventh transistor T7 can be blocked by an early disconnection of the voltage at the node between the eighth transistor T8 and the ninth transistor T9 by a pulse E* at the gate of the transistor T9, the pulse E* appearing already prior to the rising edge of the control pulse E, in the interest of exploiting the minimum delay between the control pulse E and the corresponding secondary pulse Q, so that then, the delay between the individual control pulses E and the secondary pulses Q generated by means of the converter circuit is determined by the sixth field-effect transistor T6 in the second former part F2 alone. FIG. 5 also contains details relating to an embodiment for the first former part F1, the circuit structure of which, as mentioned hereinbefore, corresponds to the heretofore known pulse former according to the hereinaforementioned publication "IEEE Journal of Solid-State Circuits". It should be noted in this connection that the heretofore known circuit is used as a pulse generator and not as a first former part F1 in the sense of the present invention in view of the disclosures of the aforementioned IEEE publication. In addition, it should be stated in this connection that the heretofore known pulse generator can be used for generating the control pulses E and also the pre-charging pulses V. For generating the precharging pulses V and the control pulses E, a clock generator according to German Published Non-Prosecuted Application (DE-OS) No. 28 37 855 may also be connected to an oscillator furnishing a periodic sequence of squarewave pulses and having a first clock output at which the control pulses TM (=E) and at a second clock output at which the pre-charging pulses TS (=V) can be taken off and can be used for the circuit according to FIG. 5.

The first former part F1 in the embodiment according to FIG. 5 is formed of eleven field-effect transistors t1 to t11 which are of the same type as the transistors T1 to T9 of the second circuit part i.e. are, in general, self-blocking. In addition, a capacitor C* is provided. The design of the circuit is in keeping with MIS technology i.e. predominantly in MOS technology, if the capacitors C1, C2 and C* of the circuit also are realized as so-called MOS varactors (more generally, as MIS varactors) and are incoporated into the monolithically integrated circuit of the pulse former.

The third signal output 3 of the first former part F1 shown in FIG. 5, which serves for acting on the capacitor C1 in the second former part F2, is connected between two series-connected transsistors t1 and t2, the drain of the first transistor t1 being connected to the first supply potential $V_{cc}$ and the gate of the first transistor t1 to the second signal output 2 of the first former part F1, while the second transistor t2 is connected by its source to the second supply potential $V_{ss}$. The gate of the second transistor t2 is controlled via the seventh and the ninth transistor t7 and t9, respectively, in a manner yet to be described hereinafter in detail. A series circuit of two further transistors t3 and t4 corresponding to the connection of the two first-mentioned transistors t1 and t2 to the two potentials is connected with a circuit point located between the two transistors t3 and t4 to one terminal of the capacitor C*, the second terminal of which is connected to the gate of the transistor t3 connected to the first supply potential $V_{cc}$ as well as to the second signal output 2 and, thereby, to the gate of the first transistor t1. The gate of the fourth transistor t4 connected to the second supply potential is directly connected to the gate of the second transistor t2 and is controlled in common therewith by means of the transistors t7 and t9. The second terminal of the aforementioned capacitor C*, finally, is connected via the source-drain path of the fifth field-effect transistor t5 to the output of the pulse generator furnishing the control pulses E.

The waveform of the potential at the second terminal of the capacitor C and, therewith, at the second signal output 2 of the first former part F1 is shown in the timing diagram of FIG. 6. In addition, FIG. 6 contains the waveform of the potential II at the terminal of the capacitor C1 facing away from the third signal output 3 in the second former part F2, and the waveforrm of the output signals A and Q, respectively, as well as the potential waveform I at the gate of the fifth transistor t5 in the first former part F1. It is readily apparent that the waveform of the potential II is equal to the waveform of the potential at the third signal output 3, and the waveform potential I is equal to the waveform of the potential I is equal to the waveform of the potential at the first signal output 1 of the first former part.

As may further be seen from FIG. 5, the gate of the fifth transistor t5 in the first former part F1 is connected to the first signal output 1 of the first former part F1 as well as via the source-drain path of the sixth transistor t6, to the first supply potential $V_{cc}$ as well as via the series circuit of the seventh and the eight transistor i.e. the two field-effect transistors t7 and t8, likewise to the first supply potential $V_{cc}$. On the other hand, the series circuit of the eight transistor t8 with the ninth transistor t9 represents a connection between the gate of the fifth transistor t5 and the first signal output 1 to the reference potential $V_{ss}$. A circuit point between the seventh transistor t7, controlled by the pre-charging pulses V, and the ninth transisitor t9 controlled by means of the tenth transistor t10 and the eleventh transistor t11 serves for making the control potential for the gates of the second transistor t2 and the fourth transistor t4 available. The transistor t8 is controlled by the control pulses E, and the transistor t6 by the pre-charging pulses V. Finally, the tenth and the eleventh transistor also form a series circuit, wherein the drain of the eleventh transistor t11, which is addressed at its gate by the control pulses E, is connected to the first supply potential $V_{cc}$, and the source of the tenth transistor t10, which is controlled by the pre-charging pulses V, is connected to the second supply potential $V_{ss}$. The circuit shown in FIG. 5 is thus described completely. It causes the formation of secondary pulses with a very fast positive edge at the signal output A and at the output furnishing the pulses Q of the second former part, respectively.

By the individual pre-charging pulse V, the node between the seventh transistor t7 and the ninth transistor t9 as well as the node between the eight transistor t8, the sixth transistor t6 and the fifth transistor t5 and, therefore, the first signal output 1 are pre-charged to the potential ($V_{cc}-U_T$) wherein $U_T$ is the threshold voltage of the transistor t6. The gates of the transistors t9 and t3 as well as the node between the transistors t3 and t4. The node between the transistors t1 and t2 as well as the output for the secondary signal Q at the second former part F2 are initially yet at the value of the second supply potential $V_{ss}$. The node between the capacitor C1 and the two transistors T2 and T3 is charged via these two transistors to the potential ($V_{cc}-2U_T$) wherein $U_T$ is the threshold voltage of the transistors causing the charging, which is assumed, for the sake of simplicity, to be the same for all of the transistors.

The control pulse E, which appears after the pre-charging pulse is extinguished, initially generates a "fast" edge at the output Q, the gate of the sixth transistor T6 in the second former part F2 being pulled up via the transfer transistor T1. The gates of the transistors T1 and t5 are boot-strapped together via the capacities of the transistors T1 and t5. Accordingly, the potential at the second signal output 2 of the first former part F1 also rises. Via the transistor T6, the output Q is pulled up directly, delayed by the switching time of the transistor T6 which is determined by the dimensions of this transistor (w/1-ratio), while the potential at the gates of the transistors T1 and t5 and at the third signal output 3 of the first former part F1 is held at a value close to the value of the reference potential $V_{ss}$.

Paralleling the foregoing, the value of the potential at the gate of the transistor T3 in the second former part F2 is bootstrapped to the maximum value of ($U_{cc}+U_T$).

As a consequence thereof, the value of the potential at the terminal of the capacitor C1 in the second former part F2, which is connected to the second transistor T2 and the third transistor T3 in the second former part F2, is pulled up via the third transistor T3, to the value of the first supply potential $V_{cc}$. Therefrom, there results a more advantageous starting position for raising the potential at the last-mentioned terminal of the first capacitor C1. Because, due to the circuit shown in FIG. 5, the potential P3 at the third signal output 3 of the first former part F1 and at the node A between the first transistor T1, the second transistor T2 and the gate of the sixth transistor T6 can have reached maximally only the value of the first supply potential $V_{cc}$, and the last-mentioned terminal of the first capacitor C1 is likewise at $V_{cc}$, the second transistor T2 in the second former part F2 remains cut off. It is opened only if the node between the senventh transistor t7 and the ninth transistor t9 in the first former part F1 is switched to the value of the reference potential $V_{ss}$, due to the delay which is caused in the first circuit part F1 by the eleventh transistor t11 and by the ninth transistor t9, respectively. The potential at the gate of the second transistor T2 the raises beyond the value of the first supply potential $V_{cc}$, the then conducting transistor T2 connecting the gate of the sixth transistor T6 to the first capacitor C1 in the second former part F2. Because the potential at the terminal of the first capacitor C1, which is connected to the second transistor T2 and the third transistor T3 in the second former part F2, is boot-strapped simultaneously, an elevated level can reach the gate of the sixth transistor T6 via the node A, the signal potential present at the output Q thereby assuming the value of the first supply potential $V_{cc}$.

The output circuit NA formed of the eighth transistor T8 and the ninth transistor T9 assures that the output Q remains permanently at the value of the reference potential $V_{ss}$ even after the precharging pulse V is switched off. However, in order then to obtain the fast positive edge of the signal occurring at the output Q, the gate of the seventh transistor T7 in the second former part F2 must be killed, in addition, via the ninth transistor T9 in the second former part F2 via the ninth transistor T9 by a pulse E* which is somewhat earlier than the control pulse E. As indicated hereinbefore, the pulse E* can be obtained without difficulty by means of the individual pre-charging pulses V in a conventional manner by means of a delay stage or an inverter.

Instead, the pre-charging pulse V can also be applied to the gate of the seventh transistor T7, so that the transistors T8 and T9 can be omitted.

As mentioned hereinbefore, the control pulse can come from any pulse generator furnishing digital pulses. If such a generator simultaneously furnishes several secondary pulses, a converter circuit according to the invention can be assigned to each signal output of the generator JG furnishing a particular kind of pulse.

The foregoing is a description corresponding in substance to German Application P No. 32 17 264.8, dated May 7, 1982, the International priority of which is being claimed for the instant application, and which is hereby made part of this application. Any material discrepancies between the foregoing specification and the aforementioned corresponding German application are to be resolved in favor of the latter.

I claim:

1. Integrated pulse former constructed in MIS circuit technology and connected to a first supply potential as well as to a second supply potential serving as a reference potential, and acted upon by control pulses from a pulse generator, comprising a first former part and a second former part both being connected to the pulse generator and directly addressed by the control pulses from the pulse generator, said first former part being connected to both the first and the second supply potentials and having three signal outputs, said second former part being additionally controlled via said three signal outputs of said first former part and being connected only to the first one of the two supply potentials, a first one of said signal outputs connected to and controlling a gate of a first field-effect transistor having a source-drain path directly connected, on one hand, to an output of the pulse generator furnishing the control pulses and, on the other hand, to a signal output of said second former part for furnishing secondary pulses, a second one of said three signal outputs of said first former part being connected to and controlling a gate of a second field-effect transistor having a source-drain path connecting said signal output of said second former part to one terminal of a capacitor having another terminal connected to the third one of said three signal outputs of said first former part, said one terminal of said capacitor connected to said second field-effect transistor being also connected via a third field-effect transistor to the first supply potential, said third field-effect transistor having a controllable gate, means connected to said gate for controlling said gate, said third field-effect transistor having a source-drain path connecting the first supply potential to a circuit node located between the source of said second field-effect transistor and said one terminal of said capacitor, said first former part being of such construction that, due to a rising edge of the control pulses from the pulse generator in said first former part:

(a) at said first signal output of said first former part, a first potential initially maintained at a value between the two supply potentials is increased to a peak value beyond that of the first supply potential immediately at the start of the rising edge of the respective control pulse and then immediately lowered to the value of the second supply potential;
    (b) at said second signal output of said first former part, a second potential initially having a value equal to that of the second supply potential is first brought to the value of the first supply potential immediately at the start of the rising edge of the respective control pulse and then, with increased rate of rise, to a value beyond that of the first supply potential which is also maintained after the falling edge of the respective control pulse; and
    (c) at said third signal output of said first former part, a third potential initially having a value equal to that of the second supply potential is raised with delay on the rising edge of the respective control pulse to the value of the first supply potential; and means provided for effecting a return of said first, second and third potentials at the respective signal outputs of said first former part to a state prevailing before onset of a final control pulse, after the end of the falling edge of the control pulses from the pulse generator and before onset of the rising edge of the next control pulse.

2. Pulse former according to claim 1 wherein said first, second and third field-effect transistors are of enhancement type and have the same channel doping, said third field-effect transistor being acted upon at the gate thereof by the first supply potential.

3. Pulse former according to claim 2 wherein said gate of said third field-effect transistor is connected directly to the first supply potential.

4. Pulse former according to claim 1, wherein the gate of said third field-effect transistor is controlled by pre-charging pulses occurring in spaces between the control pulses, said field-effect transistors of said second former part having identical channel dopings, said third field-effect transistor being of depletion type and said first and said second field-effect trasistors being of enhancement type.

5. Pulse former according to claim 2, wherein a fourth field-effect transistor and a fifth field-effect transistor of the same type as that of said first, second and third field-effect transistors, as well as a second capacitor are provided in said second former part and said gate of said third field-effect transistor being connected to the first supply potential via parallel-connected source-drain paths of said fourth and said fifth field-effect transistors, said gate of said third field-effect transistor being also connected to a gate of said fifth field-effect transistor and, via said second capacitor, to an output of the pulse generator furnishing the control pulses, and fourth field-effect transistor having a gate connected to the first supply potential.

6. Pulse former according to claim 1, wherein said first former part comprises eleven field-effect transistors of the same type as that of said first field-effect transistor in said second former part, and a capacitor, and is controlled not only by the control pulses from the pulse generator but also by pre-charging pulses confined to the spaces between adjacent control pulses.

7. Pulse former according to claim 6 wherein a first field-effect transistor of said first former part is connected by its drain to the first supply potential and forms with its source said third signal output of said first former part, the source of the first field-effect transistor of said first former part being connected via a source-drain current path of the second field-effect transistor of said first former part to the second supply potential; said first transistor of said first former part having a gate connected, on one hand, to the second signal output and, on the other hand, to a gate of a third field-effect transistor of said first former part as well as to one terminal of a capacitor having a second terminal connected to a source terminal of said third transistor of said first former part also having a drain connected to the first supply potential, and being connected by said source terminal thereof via a source-drain current path of a fourth transistor of said first former part to the second supply potential; respective gates of the second and the fourth transistor of said first former part being jointly connected to a circuit node located between the source of a seventh and the drain of a ninth transistor of said first former part, the drains of the second and fourth transistors, respectively, of said first former part being connected to the sources of the third and first transistors, respectively of said first former part, and the sources of the second and fourth transistors being connected to the second supply potential, said seventh transistor being connected by its drain terminal to the first potential and being controlled via its gate by the pre-charging pulses, said seventh transistor being also connected by its source terminal via the source-drain path of an eighth field-effect transistor of said first former part controlled via its gate by control pulses from the pulse generator, to said first signal output of said first former part as well as to a gate of a fifth transistor of said first former part and to the source of a sixth transistor of said first former part; a source terminal of said fifth field-effect transistor of said first former part being connected to said gate of said third field-effect transistor of said first former part, and the drain terminal of said fifth field-effect transistor of said first former part to the output of the pulse generator furnishing the control pulses, the drain of said sixth transistor being connected to the terminal for the first supply potential, and the gate of said sixth transistor being controlled by said pre-charging pulses; said pre-charging pulses further serving for controlling the gate of a tenth field-effect transistor of said first former part having a source terminal connected to the second supply potential and having a drain connected to the gate of the ninth transistor and to the first supply potential via a source-drain path of an eleventh field-effect transistor of said first former part controlled via its gate by the control pulse; the respective sources of said ninth transistor as well as said second transistor of said first former part, said fourth transistor of said first former part and said tenth transistor of said first former part being connected to the second supply potential.

8. Pulse former according to claim 5, wherein the signal output of said second former part is connected to a gate of a sixth field-effect transistor of the same type as that of said first transistor in said second former part; said sixth transistor having a drain connected to the first supply potential and having a source terminal forming, a further signal output of said second former part and, in addition, being connected via a source-drain path of a seventh field-effect transistor to the second supply potential, said seventh field-effect transistor having a gate controlled either by said pre-charging pulses or by an output circuit controlled by the control pulse and a further pulse and formed of an eighth and a ninth field-effect transistor.

9. Pulse former according to claim 1 wherein the control means connected to said gate of said third field-effect transistor are the first supply potential.

10. Pulse former according to claim 1 wherein the control means connected to said gate of said third field effect transistor are a source of pre-charging pulses applied to said first former part for controlling said first former part.

* * * * *